United States Patent [19]

Sosin

[11] 4,337,439

[45] Jun. 29, 1982

[54] WIDE BAND AMPLIFIERS

[75] Inventor: Boleslaw M. Sosin, Chelmsford, England

[73] Assignee: The Marconi Company Limited, Chelmsford, England

[21] Appl. No.: 88,063

[22] Filed: Oct. 24, 1979

[30] Foreign Application Priority Data

Nov. 14, 1978 [GB] United Kingdom ............... 44336/78

[51] Int. Cl.³ .......................... H03F 3/60; H03F 3/28
[52] U.S. Cl. ..................................... 330/54; 330/118
[58] Field of Search ................. 330/53, 55, 57, 124 R, 330/286, 54, 118

[56] References Cited

U.S. PATENT DOCUMENTS 2,018,320  10/1935  Roberts ............................ 330/53 X
3,129,387  4/1964  Sosin ................................. 330/54
3,593,174  7/1971  White ................................ 330/53
4,092,616  5/1978  Osterwalder ..................... 330/53 X

*Primary Examiner*—James B. Mullins
*Attorney, Agent, or Firm*—Spencer & Kaye

[57] ABSTRACT

A distributed amplifier is provided with an output filter line with the output terminals of a plurality of individual amplifying devices connected to different points along the output filter line. Instead of dimensioning the impedance of the output filter line to provide a perfectly uniform frequency response, it is arranged as a wide band multiple quarter wave impedance transformer. The use of this kind of output filter line provides superior performance when the amplifier is used with mismatched loads and the frequency response can still be very good.

7 Claims, 2 Drawing Figures

WIDE BAND AMPLIFIERS

This invention relates to wide band amplifiers of the kind known as distributed amplifiers wherein the capacitances associated with a number of amplifying devices are used as shunt arms of filter sections connected between the output terminals and the input terminals respectively of the amplifying devices, and wherein the amplifying devices are connected effectively in parallel. By virtue of the fact that stray capacitances associated with the amplifying devices and the wiring do not add in parallel but constitute, at least in part, the shunt arms of the filter sections, this type of amplifier is well suited to the amplification of frequencies over a wide band.

One known example of this kind of wide band amplifier using vacuum valves is described in our U.K. patent specification No. 846,633, in which the output filter sections constitute a transmission line having a uniform impedance portion, followed by a tapered impedance portion in which the characteristic impedance of each filter stage decreases progressively towards the output point of the amplifier. Although this amplifier was capable of operating at greater efficiency than earlier examples of distributed amplifiers when operating into a matched load, the performance obtainable with a mismatched load was not nearly so satisfactory. Amplifiers of this kind are used for broad band radio transmission purposes, for example, and since the effective impedance of an antenna is a function of frequency, it is not possible to ensure that the amplifier feeds a load which is matched to the output characteristic impedance of the amplifier over the whole of the frequency band.

The present invention seeks to provide a wide band amplifier in which the dependence on correct impedance matching is reduced.

According to this invention a distributed amplifier includes a plurality of amplifying devices having their individual control terminals connected to different points along an input filter line which has a predetermined passband, and the output terminals of the amplifying devices being connected to different points along an output filter line which has a predetermined pass band which includes a band of frequencies which is also included in the passband of the input filter line, said points along the output filter line being so chosen that delays between said output terminals are substantially the same as the delays between the corresponding control terminals, and shunt arms in said filter lines being constituted at least in part in internal capacitances of the amplifying device; said output filter line being provided with a portion over which its impedance is tapered so as to constitute a wide band multiple quarter wave impedance transformer between the output point at one end of the filter line and a termination impedance at the other end of the filter line.

Preferably the portion of the said output filter line over which the impedance is tapered to constitute the impedance transformer extends between the points on the line to which the first and last amplifying devices are connected.

Preferably the amplifying devices are vacuum valves, in which case the output terminal of each is constituted by its anode connection.

The said output filter line is preferably composed of a plurality of sections, each of which has a different characteristic impedance.

Preferably again the impedances of the different sections vary in accordance with an exponential law from one end of the output filter line to the other.

Preferably again the termination impedance is constituted by a resistor having a value which is chosen at a high value limited by the anode capacitance of the valve adjacent to it.

Although the properties of the output filter line are chosen to provide a wide band impedance match so as to enable power to be efficiently fed to a load of variable impedance over a wide frequency band, it is found that for a particular load the output power level is surprisingly uniform over the frequency band of the amplifier. It may not be quite as uniform as it would be if the characteristics of the output filter line were chosen primarily to provide a uniform response when the amplifier feeds into an optimum value load, as is the case with out previous patent specification referred to above. However, when this previously known basis is used to design the output filter line, the amplitude-frequency response deteriorates significantly for mismatched loads. In practice, therefore, the present invention is capable of providing a much more satisfactory and efficient operation over a wide band frequency range under practical operating conditions.

The present invention is further described by way of example with reference to the accompanying drawings which illustrates diagrammatically two wide band amplifier circuits in accordance with the present invention. In the drawing the normal d.c. and other connections which are not necessary for an understanding of the invention have been omitted.

Figure 1:
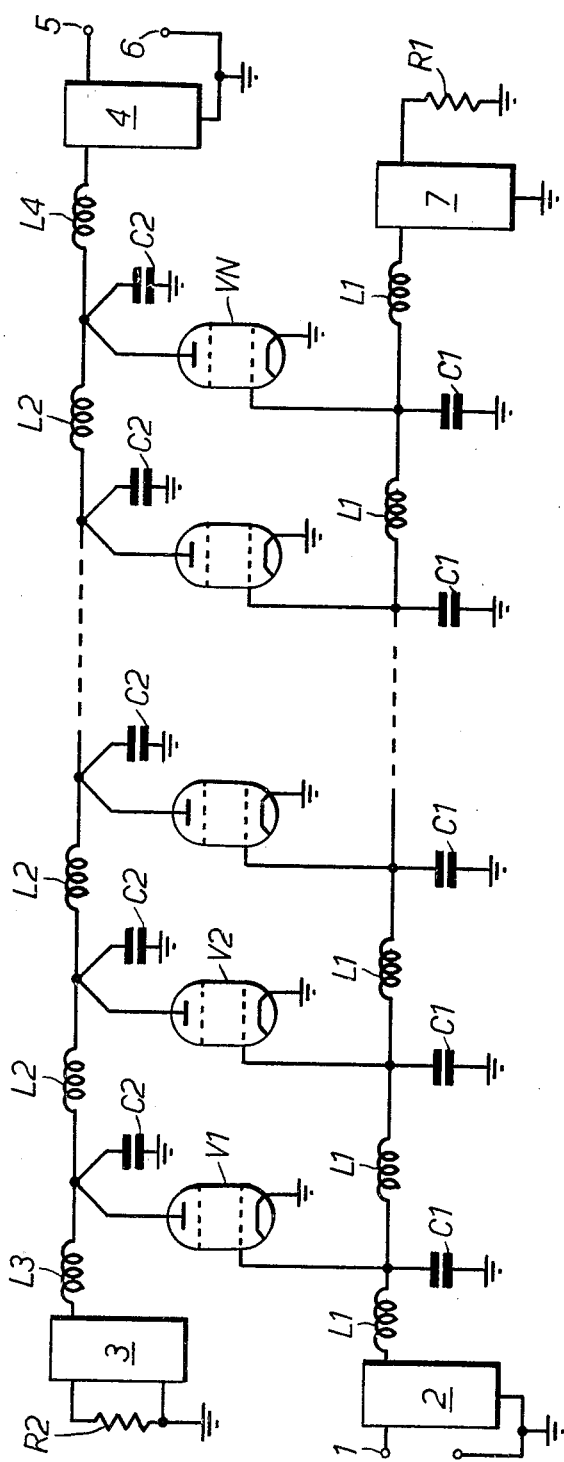
FIG. 1 is a circuit diagram of a preferred embodiment of a wide band amplifier circuit according to the invention.

Referring to FIG. 1, signals are fed via an input terminal 1 and an impedance matching network 2 to an input filter line or chain which comprises a number of similar series arm inductances L1, and the input capacitance of a number of similar vacuum valves V1, V2 ... VN and the capacitors C1 constitute the shunt arms of the filter line. The control grids of the valves are connected to different points between the inductances L1, and these points are so chosen that substantially equal voltages are fed to the control grids. The input filter chain is correctly terminated by resistance R1 via an impedance matched network 7 and the cathodes of the valves are earthed as shown. The anodes of the valves are connected to different points of an output filter line which consists of series inductances L2 and shunt capacitances C2. These inductances L2 and capacitances C2 are not all of equal value, but differ so that the output filter line is dimensioned so as to constitute a wide band multiple quarter wave impedance transformer and is preceded by a terminating resistor R2 and inductor L3 and if necessary an impedance matching circuit 3. The effective value of the terminating impedance is chosen at a high value which is limited by the anode capacitance of the first valve V1 of the amplifier. To minimise the effective capacitance of the first stage of the output filter line, the capacitor C2 connected to valve V1 can be omitted. The output end of the output filter line is connected via an inductor L4 and a further impedance matching network 4 to terminals 5 and 6, from which in operation a radiating antenna (not shown) is fed.

The inductances L1 are chosen to constitute in conjunction with the input capacitance of the valves and the capacitors C1, a filter of suitable passband and characteristic impedances. The parameters of the output filter line, on the other hand, are such as to provide a suitable broad band characteristic impedance transformer. The anodes of the valves are connected to this output filter chain at such points that the phase delay between the anodes of chosen valves is substantially the same as the phase delay between their corresponding control grids.

The impedance of the output filter chain is tapered so as to provide an impedance match between the effective value of the terminating resistor R2 (as modified by the impedance matching network 3) and the nominal antenna impedance (as modified by the impedance matching network 4) at the output end of the output filter chain. One of the more useful laws which determines the taper is the exponential in which the characteristic impedance of the individual sections of the output filter line are given by:

$$Zo[n] = R_T \times r^{(n-0.5)}$$

wherein
$r = NT\sqrt{RL/RT}$
n = section number starting from the termination end
RT = effective value of the termination resistance
RL = effective value of the match load resistance
NT = total number of sections Instead of the exponential law, alternative laws such as binominal or Chebyshev may be used.

The choice of the load resistance is a compromise. If too high a value is chosen the impedance taper of the output filter line will become negligible and eventually will approach a distributed amplifier with a uniform line and consequently it will be relatively inefficient in operation. However, too low a value will reduce the anode voltage swings of the valves and will also be inefficient. The correct value is therefore a compromise between these two extremes.

Although screen grid valves are illustrated in the drawing other types may be used if required. For example, a pair of triodes in cascode connection may be substituted for each valve shown. In fact, any kind of amplifying device which on its own is not capable of providing a broad band operation because of relatively high reactances associated with it may be advantageously used in the distributed amplifier of the kind shown in the drawings. Additionally, although relatively simple filter sections are illustrated more complex versions may be used as required.

Figure 2:
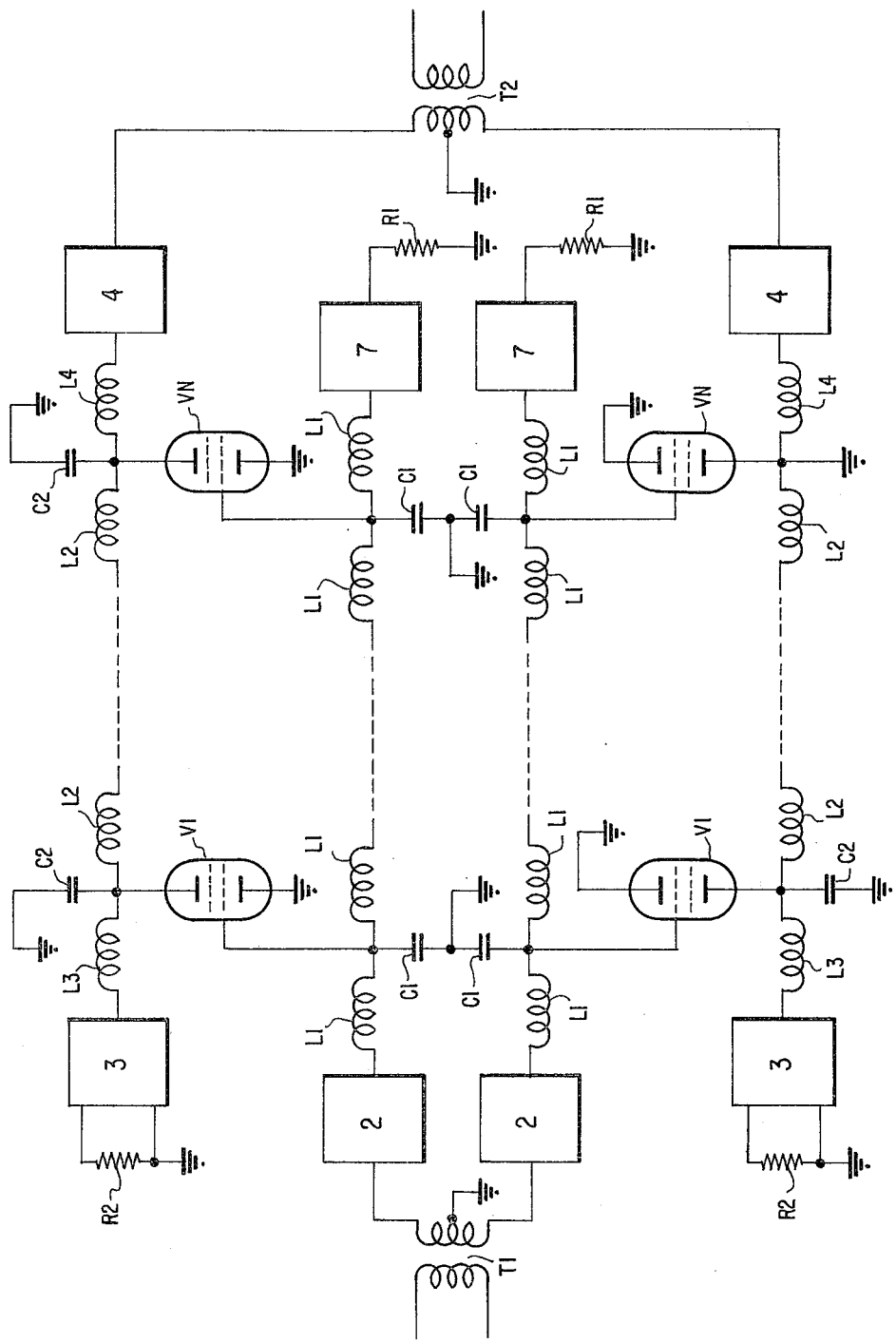
FIG. 2 is a circuit diagram of a further embodiment of a circuit according to the invention in the form of a push-pull circuit composed of two of the circuits of FIG. 1.

A disadvantage often encountered with wide band amplifiers is the generation of second harmonics of the signal frequencies. It is therefore preferred to embody the present invention in push-pull amplifier form, as shown in FIG. 2, with the input connected via a transformer T1 to two input filter chains L1, V, C1 and the output taken from two output filter chains L2, C2 e.g. by means of a transformer T2. With such amplifiers second harmonics can be effectively eliminated from the output although, of course, it is necessary to provide twice the number of amplifying devices.

I claim:

1. A distributed amplifier including a plurality of amplifying devices having their individual control terminals connected to different points along an input filter line which has a predetermined passband, and the output terminals of the amplifying devices being connected to different points along on an output filter line which has an output load at one end and has a predetermined passband which includes a band of frequencies which is alos included in the passband of the input filter line, said points along the output filter line being so chosen that delays between said output terminals are substantially the same as the delays between the corresponding control terminals, and shunt arms in said filter lines being constituted at least in part by internal capacitances of the amplifying device; said amplifier further comprising a termination impedance connected to the other end of said output filter line, and said output filter line being substantially wholly reactive and being provided with a portion over which its impedance is tapered so as to constitute a wide band multiple quarter wave impedance transformer providing an impedance match between said output load at one end of said output filter line and said termination impedance at said other end of said output filter line.

2. An amplifier as claimed in claim 1 and wherein the portion of the said output filter line over which the impedance is tapered to constitute the impedance transformer extends between the points on the line to which the first and last amplifying devices are connected.

3. An amplifier as claimed in claim 1 and wherein the amplifying devices are vacuum valves, in which case the output terminal of each is constituted by its anode connection.

4. An amplifier as claimed in claim 1 and wherein said output filter line is composed of a plurality of sections each of which has a different characteristic impedance.

5. An amplifier as claimed in claim 4 and wherein the impedances of the different sections vary in accordance with an exponential law from one end of the output filter line to the other.

6. An amplifier as claimed in claim 3 and wherein the termination impedance is constituted by a resistor having a value which is chosen at a high value limited by an anode capacitance of the valve adjacent to it.

7. A push-pull amplifier arrangement comprising two substantially identical amplifiers each as claimed in any of the preceding claims, means for applying input signals in push-pull between the input terminals of said amplifiers and means for taking output signals in push-pull from between the output terminals of said amplifiers.

* * * * *